(12) United States Patent
Klaba et al.

(10) Patent No.: US 12,041,744 B2
(45) Date of Patent: Jul. 16, 2024

(54) RACK FOR A DATA CENTER

(71) Applicant: OVH, Roubaix (FR)

(72) Inventors: Henryk Klaba, Roubaix (FR); Jules Hermann Bonenfant, Lys lez Lannoy (FR); Valentin Cartigny, Mons-en-Baroeul (FR)

(73) Assignee: OVH, Roubaix (FR)

( * ) Notice: Subject to any disclaimer, the term of this patent is extended or adjusted under 35 U.S.C. 154(b) by 0 days.

(21) Appl. No.: 17/458,868

(22) Filed: Aug. 27, 2021

(65) Prior Publication Data
US 2022/0071044 A1    Mar. 3, 2022

(30) Foreign Application Priority Data

Aug. 31, 2020 (EP) ..................... 20315398

(51) Int. Cl.
*H05K 7/14*    (2006.01)
*B65D 19/00*   (2006.01)

(52) U.S. Cl.
CPC ....... *H05K 7/1488* (2013.01); *B65D 19/0038* (2013.01); *B65D 2519/00024* (2013.01)

(58) Field of Classification Search
CPC ........ H05K 7/1488; H05K 7/183; H05K 7/14; H05K 7/1489; H05K 7/18; H05K 7/1492;
(Continued)

(56) References Cited

U.S. PATENT DOCUMENTS 2,544,743 A  *  3/1951  Vrabcak ............. B65D 19/0038
                                                 108/52.1
3,135,228 A  *  6/1964  Fleming ............. B65D 19/0012
                                                 108/57.34
(Continued)

FOREIGN PATENT DOCUMENTS

CN   109315076 A    2/2019
CN   109907552 A    6/2019
(Continued)

OTHER PUBLICATIONS

"Racklift™ Compared to the Competitor", Data Center Device Lifter Comparison—RackLift, retrieved on Jun. 29, 2020 from https://racklift.com/data-center-lifting-tool/, pdf 3 pages.
(Continued)

*Primary Examiner* — Ko H Chan
(74) *Attorney, Agent, or Firm* — BCF LLP

(57) ABSTRACT

A rack for supporting data center equipment has a frame including vertical wall supports are connected to a base and extending upwardly therefrom. The base defines a first and second openings extending in a lateral direction for receiving a fork of a lifting machine along the lateral direction. The base includes: a first upper wall and a second upper wall defining in part the first opening and the second opening; a lower wall disposed between the upper walls along a depth direction of the rack and extending vertically lower than the upper walls; and two side walls extending vertically from the lower wall to a respective one of the upper walls. The two side walls and the lower wall together define a middle cavity. Each of the two side walls defines a third opening and a fourth opening for receiving the fork of the lifting machine along a depth direction.

11 Claims, 15 Drawing Sheets

(58) Field of Classification Search
CPC ........... B65D 2519/00024; B65D 2519/00059; B65D 2519/00199; B65D 2519/00164; B65D 19/0038; B65D 19/004
See application file for complete search history.

(56) References Cited

U.S. PATENT DOCUMENTS

| | | | | |
|---|---|---|---|---|
| 3,167,341 | A | * | 1/1965 | Higgins ............. B65D 19/0048 294/67.4 |
| 3,353,854 | A | * | 11/1967 | Hansen ................ E04B 1/5818 403/171 |
| 3,589,547 | A | * | 6/1971 | Hambleton ........... B01F 33/503 220/4.28 |
| 4,145,974 | A | * | 3/1979 | Fleming ............... B65D 19/004 108/57.29 |
| 4,145,975 | A | * | 3/1979 | Colbert ............. B65D 19/0044 108/52.1 |
| 4,287,997 | A | * | 9/1981 | Rolfe ..................... B65D 19/08 220/23.6 |
| 4,385,781 | A | * | 5/1983 | Welsch ............. H05K 13/0069 294/143 |
| 4,408,544 | A | * | 10/1983 | Haataja ............. B65D 19/0016 108/901 |
| 4,664,265 | A | * | 5/1987 | George, Jr. ............. B25H 3/04 206/707 |
| 4,718,858 | A | | 1/1988 | Godfrey et al. |
| 4,938,358 | A | * | 7/1990 | Johansen ................ B65D 85/62 206/499 |
| 5,503,085 | A | * | 4/1996 | Rozek ................ B65D 19/0087 108/51.3 |
| 7,201,251 | B1 | | 4/2007 | Baird |
| 7,646,590 | B1 | * | 1/2010 | Corhodzic ........... H05K 7/1492 361/644 |
| 7,978,463 | B1 | * | 7/2011 | Haun ........................ E04H 5/02 361/679.01 |
| 8,233,270 | B2 | | 7/2012 | Pierson et al. |
| 8,467,175 | B2 | | 6/2013 | Schmitt et al. |
| 8,875,909 | B2 | * | 11/2014 | Gerkensmeier ........ B65D 25/06 211/175 |
| 9,282,660 | B2 | | 3/2016 | Bailey et al. |
| 9,686,882 | B2 | | 6/2017 | Bailey et al. |
| 9,907,212 | B2 | | 2/2018 | Parizeau et al. |
| 10,219,400 | B2 | | 2/2019 | Klaba et al. |
| 10,709,034 | B2 | * | 7/2020 | Jochim ................ H05K 7/1489 |
| 2015/0334866 | A1 | * | 11/2015 | Bailey .................... H05K 7/183 312/223.2 |
| 2016/0362223 | A1 | * | 12/2016 | Sengelin ............... B65D 19/385 |
| 2019/0104636 | A1 | | 4/2019 | Jochim et al. |
| 2019/0261534 | A1 | | 8/2019 | Jochim et al. |

FOREIGN PATENT DOCUMENTS

| | | |
|---|---|---|
| WO | 1998047335 A1 | 10/1998 |
| WO | 2014191532 A1 | 12/2014 |
| WO | 2017223539 A1 | 12/2017 |

OTHER PUBLICATIONS

European Search Report with regard to the counterpart EP Patent Application No. 20315398.6 completed Feb. 12, 2021.
Office Action with regard to the counterpart CN Patent Application No. 2021110043785 dated Nov. 30, 2023.

* cited by examiner

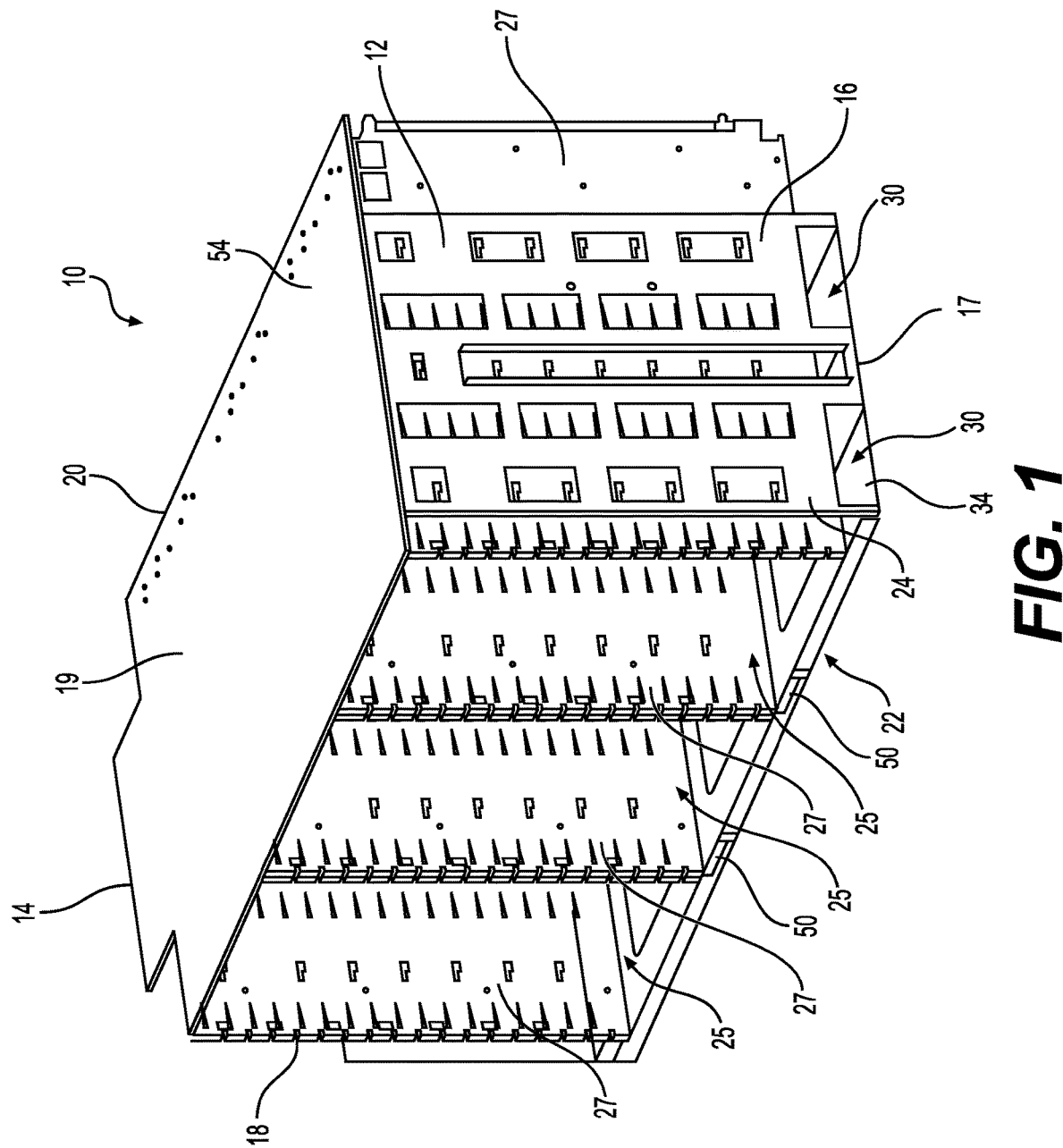

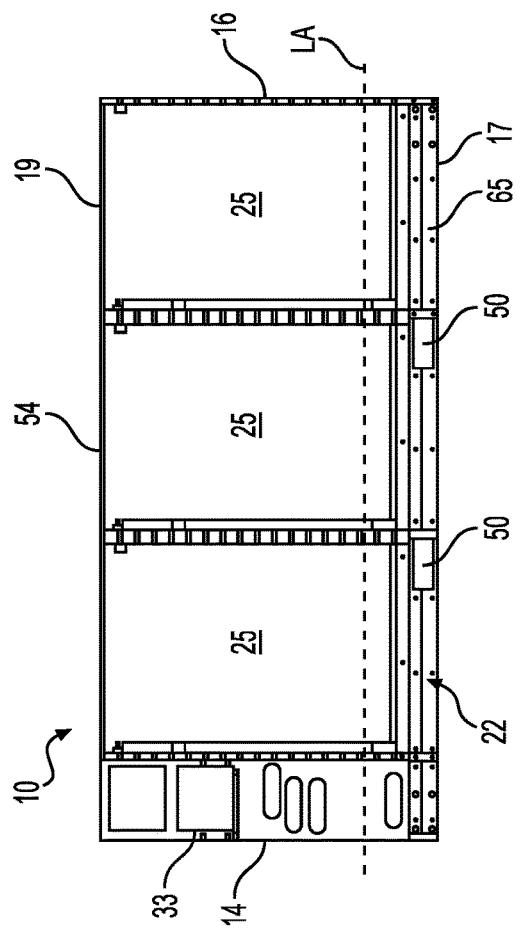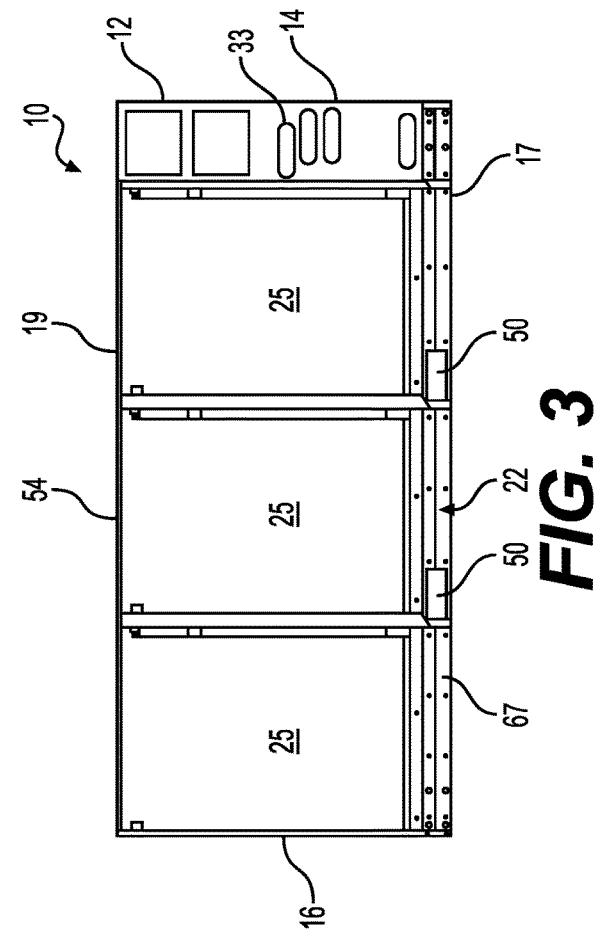

RACK FOR A DATA CENTER

CROSS-REFERENCE

The present application claims priority from European Patent Application No. 20315398.6, filed Aug. 31, 2020, the entirety of which is incorporated by reference herein.

FIELD OF TECHNOLOGY

The present disclosure relates to racks used in data centers.

BACKGROUND

Data centers typically employ racks in order to store servers and other supporting equipment therein. Notably, such racks are usually installed in rows in order to better manage heat within the data center.

In order to facilitate displacing the racks around the data center, the racks are often provided with openings along a bottom part of their frame to accommodate the insertion of a forklift or other lifting machine's fork. The forklift can thus engage the rack by inserting its fork into the openings and lift the rack to move it as desired. So as to allow the forklift or other lifting machines (e.g., stackers, pallet jacks, etc.) to navigate through the data center, passages are cleared within the data center to ensure that the lifting machines can fit therethrough and manoeuvre as required. However, it is generally desirable to use as much floor space as possible for the racks so as to increase the efficiency of the data center. Thus, reserving space for passages within the data center runs counter to maximizing its efficiency.

Furthermore, in many cases, the amount of weight supported by the racks can be significant. Therefore the racks have to be built correspondingly so that their structure is able support that weight. However, it is also important to manage the costs associated with producing the racks.

Therefore, there is a need for a rack which overcomes or reduces at least some of the above-described drawbacks.

SUMMARY

It is an object of the present technology to ameliorate at least some of the inconveniences present in the prior art.

According to an aspect of the present technology, there is provided a rack for supporting data center equipment. The rack has a frame having first and second lateral ends opposite one another in a lateral direction of the rack, and front and rear ends opposite one another in a depth direction of the rack, the depth direction being perpendicular to the lateral direction. The frame includes: at least two vertical wall supports laterally spaced apart from one another, and a base defining a bottom portion of the rack. The at least two vertical wall supports are connected to the base and extend upwardly therefrom. The base defines a first opening and a second opening extending in the lateral direction of the rack for receiving a fork of a lifting machine along the lateral direction of the rack. The base includes: a first upper wall defining in part the first opening; a second upper wall defining in part the second opening, the second upper wall being generally parallel to the first upper wall; a lower wall disposed between the first and second upper walls along the depth direction, the lower wall extending vertically lower than the first and second upper walls; and two side walls extending at least partly vertically from the lower wall to a respective one of the first and second upper walls, the two side walls and the lower wall defining together a middle cavity, each of the two side walls defining a third opening and a fourth opening for receiving the fork of the lifting machine along the depth direction of the rack.

In some embodiments, the at least two vertical wall supports extend into the middle cavity.

In some embodiments, the at least two vertical wall supports includes at least four vertical wall supports laterally spaced apart from one another.

In some embodiments, the base has an upper base member defining the first and second upper walls and the lower wall, the upper base member being a single piece component.

In some embodiments, the base includes: an upper base member defining the first and second upper walls and the lower wall; and a lower base member extending below the upper base member and forming a bottom horizontal wall that defines, together with the upper base member, the first and second openings.

In some embodiments, at least a majority of the base is made of sheet metal.

In some embodiments, the data center equipment includes servers, the rack also includes a plurality of rails connected to the at least two vertical wall supports for supporting the servers.

In some embodiments, a width of the rack measured between the first and second lateral ends is greater than a height of the rack measured between a lower end and an upper end of the rack.

In some embodiments, each of the at least two vertical wall supports is mechanically fastened to the base.

In some embodiments, part of a cross-sectional profile of the base taken along a vertical plane extending in the depth direction has a step-function shape; and the first and second upper walls and the lower wall form horizontal parts of the step-function shape.

In some embodiments, the frame also includes an upper frame member extending parallel to the base, the upper frame member being connected to an upper end of each of the at least two vertical wall supports.

In some embodiments, the frame also includes alignment features extending upwardly from the upper frame member for aligning the rack with an other rack stacked thereon.

In some embodiments, the first and second openings extend from a first lateral end of the base to a second lateral end of the base.

In some embodiments, the base has a front wall and a rear wall opposite one another in the depth direction, each of the front wall and the rear wall defining a fifth opening and a sixth opening that are laterally spaced from one another, the fifth opening and the sixth opening being aligned with the third opening and the fourth opening respectively.

According to another aspect of the present technology, there is provided a base for a rack configured to support data center equipment. The base comprises: a first upper wall defining in part a first opening extending in a lateral direction of the base; a second upper wall defining in part a second opening extending in the lateral direction of the base, the second upper wall being generally parallel to the first upper wall, the first opening and the second opening being configured to receive a fork of a lifting machine along the lateral direction of the base; a lower wall disposed between the first and second upper walls along a depth direction of the base, the lower wall extending vertically lower than the first and second upper walls; and two side walls extending at least partly vertically from the lower wall to a respective one of the first and second upper walls, the two side walls and the lower wall defining together a middle cavity, each of the two side walls defining a third opening and a fourth opening for receiving the fork of the lifting machine along the depth direction of the base.

In some embodiments, the base comprises an upper base member defining the first and second upper walls and the lower wall, the upper base member being a single piece component.

In some embodiments, the base comprises: an upper base member defining the first and second upper walls and the lower wall; and a lower base member extending below the upper base member and forming a bottom horizontal wall that defines, together with the upper base member, the first and second openings.

In some embodiments, at least a majority of the base is made of sheet metal.

In some embodiments, part of a cross-sectional profile of the base taken along a vertical plane extending in the depth direction has a step-function shape; and the first and second upper walls and the lower wall form horizontal parts of the step-function shape.

In some embodiments, the first and second openings extend from a first lateral end of the base to a second lateral end of the base.

In some embodiments, the base has a front wall and a rear wall opposite one another in the depth direction, each of the front wall and the rear wall defining a fifth opening and a sixth opening that are laterally spaced from one another, the fifth opening and the sixth opening being aligned with the third opening and the fourth opening respectively.

Embodiments of the present technology each have at least one of the above-mentioned object and/or aspects, but do not necessarily have all of them. It should be understood that some aspects of the present technology that have resulted from attempting to attain the above-mentioned object may not satisfy this object and/or may satisfy other objects not specifically recited herein.

Additional and/or alternative features, aspects and advantages of embodiments of the present technology will become apparent from the following description, the accompanying drawings and the appended claims.

BRIEF DESCRIPTION OF DRAWINGS

Further aspects and advantages of the present technology will become better understood with reference to the description in association with the following in which:

FIG. 1 is a perspective view, taken from a top, right side, of a rack according to an embodiment of the present technology;

FIG. 2 is a front elevation view of the rack of FIG. 1;

FIG. 3 is a rear elevation view of the rack of FIG. 1;

DETAILED DESCRIPTION

A rack 10 in accordance with an embodiment of the present technology is shown in FIG. 1. The rack 10 is designed to be used in a data center which is defined herein as a facility whose purpose is to house computer systems and associated components. As such, in this embodiment, the rack 10 is configured to support, amongst other equipment, computer systems such as servers 23 (shown schematically in dashed lines in FIG. 6) which store and process information. The rack 10 also supports other data center equipment including heat exchangers such as air-to-liquid heat exchangers (not shown). In some embodiments, the rack 10 may not support computer systems and may instead be solely used within the data center for supporting heat exchanging equipment.

Figure 16:
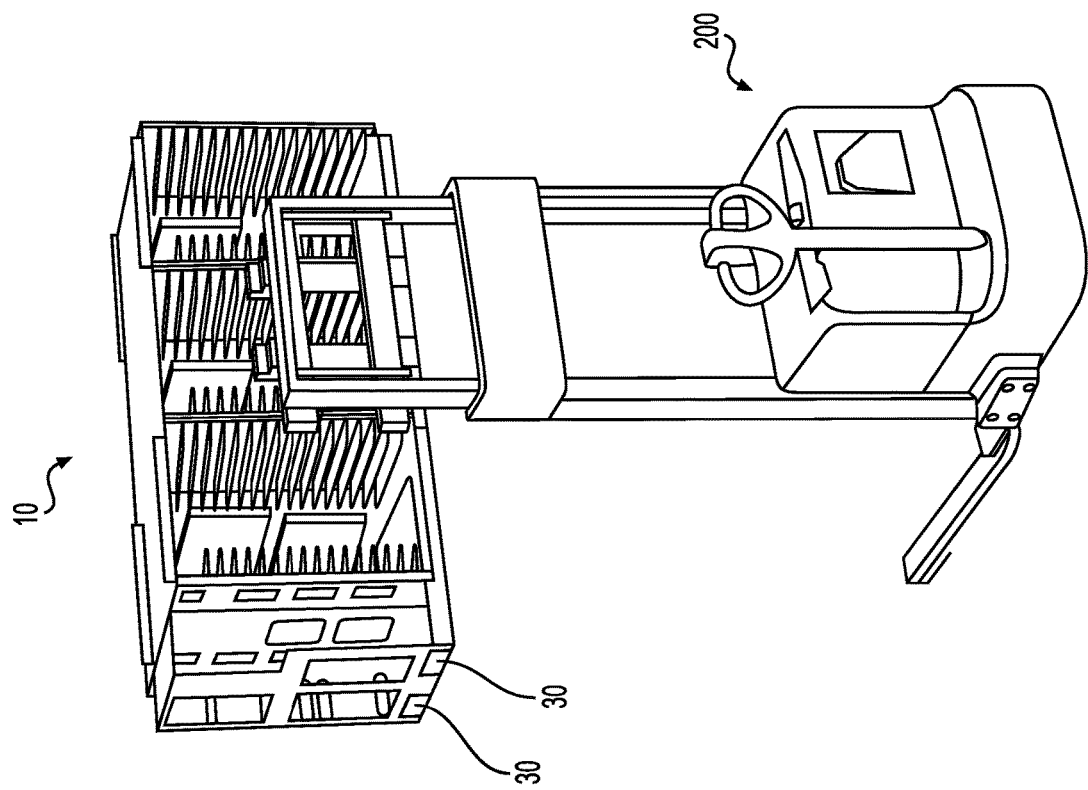
FIG. 16 shows the rack being engaged by a lifting machine along a depth direction of the rack.
Figure 17:
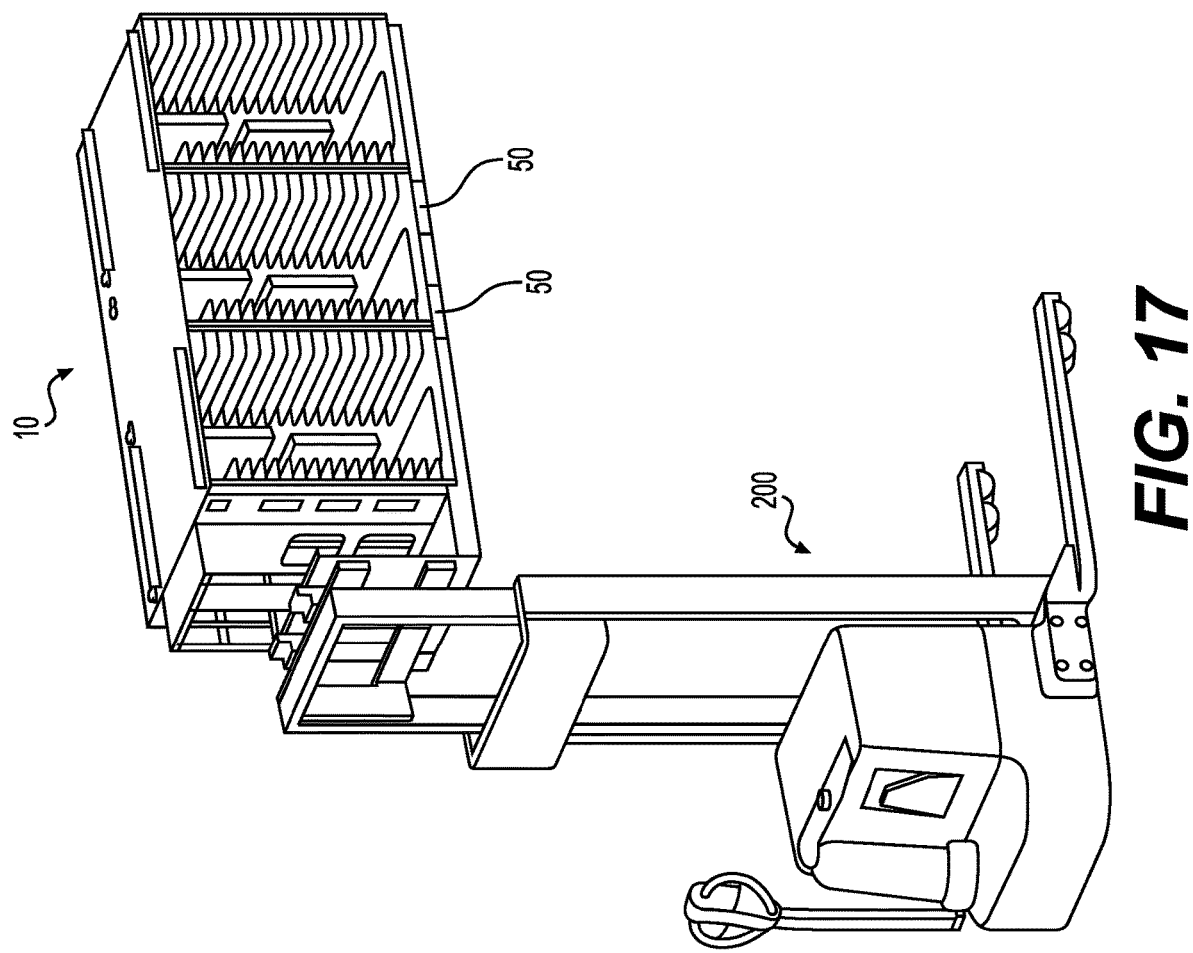
FIG. 17 shows the rack being engaged by the lifting machine along the lateral direction of the rack.

As will be described in detail below, the rack 10 is built so as to allow a greater versatility in handling thereof when transporting the rack 10. Notably, as shown in FIGS. 16 and 17, the rack 10 can be engaged by a lifting machine 200 (e.g., a forklift, a stacker, a pallet jack) in two perpendicular directions, namely in a lateral direction and a depth direction of the rack 10. This provides an operator with more flexibility for moving the rack 10 around the data center. Furthermore, as will be explained below, the rack 10 is built so that its manufacture is simple but in such a way as to provide sufficient rigidity for supporting the weight exerted by the data center equipment supported by the rack 10. The rack 10 is therefore rigid yet cost effective to produce.

As shown in FIGS. 2 and 3, the rack 10 has a frame 12 having a left lateral end 14 and a right lateral end 16 which are opposite one another in the lateral direction of the rack 10. The frame 12 also has a front end 18 and a rear end 20 which are opposite one another in the depth direction of the rack 10. The lateral direction and the depth direction of the rack 10 are thus perpendicular to one another. As can be seen, the rack 10 has a greater width, measured between the lateral ends 14, 16, than a height thereof, measured between a lower end 17 and an upper end 19 of the rack 10.

The frame 12 has a base 22 defining a bottom portion of the rack 10. As such, the base 22 is configured to be supported on a ground surface of the data center or on a rack-supporting frame. The base 22 will be described in greater detail below.

The frame 12 also has a plurality of vertical wall supports 24 that are connected to the base 22 and extend upwardly therefrom. In particular, the vertical wall supports 24 are mechanically fastened to the base 22. The expression "mechanically fastened" used herein refers to the components being fastened by means of mechanical fasteners. Namely, in this example, rivets are used to mechanically fasten the components. In other examples, bolts or other mechanical fasteners may be used. In yet other embodiments, the different components may be welded to one another rather than being mechanically fastened.

Figure 7:
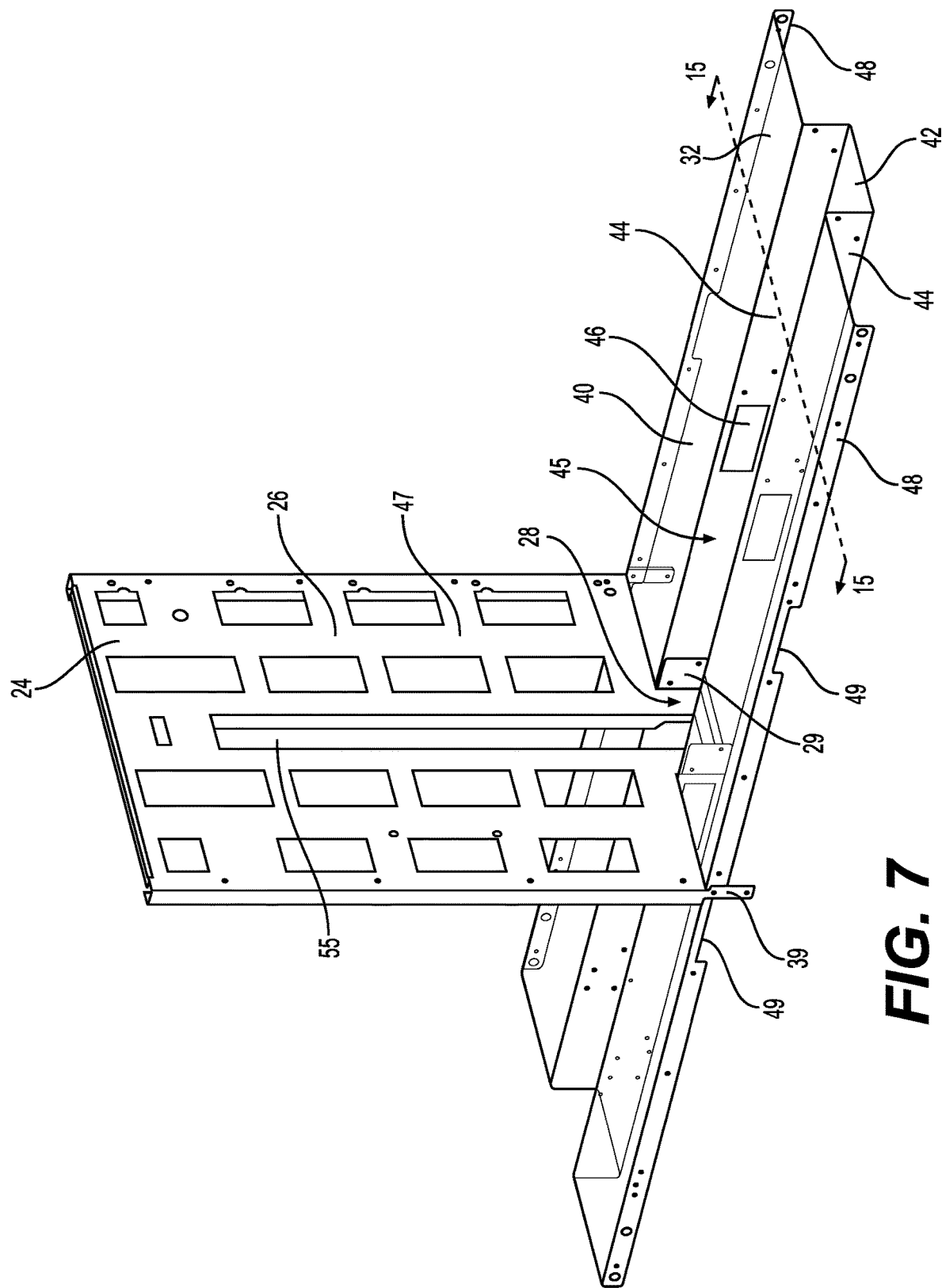
FIG. 7 is a perspective view, taken from a top, right side, of an upper base member and a vertical wall support of a frame of the rack as the rack is being assembled.
Figure 8:
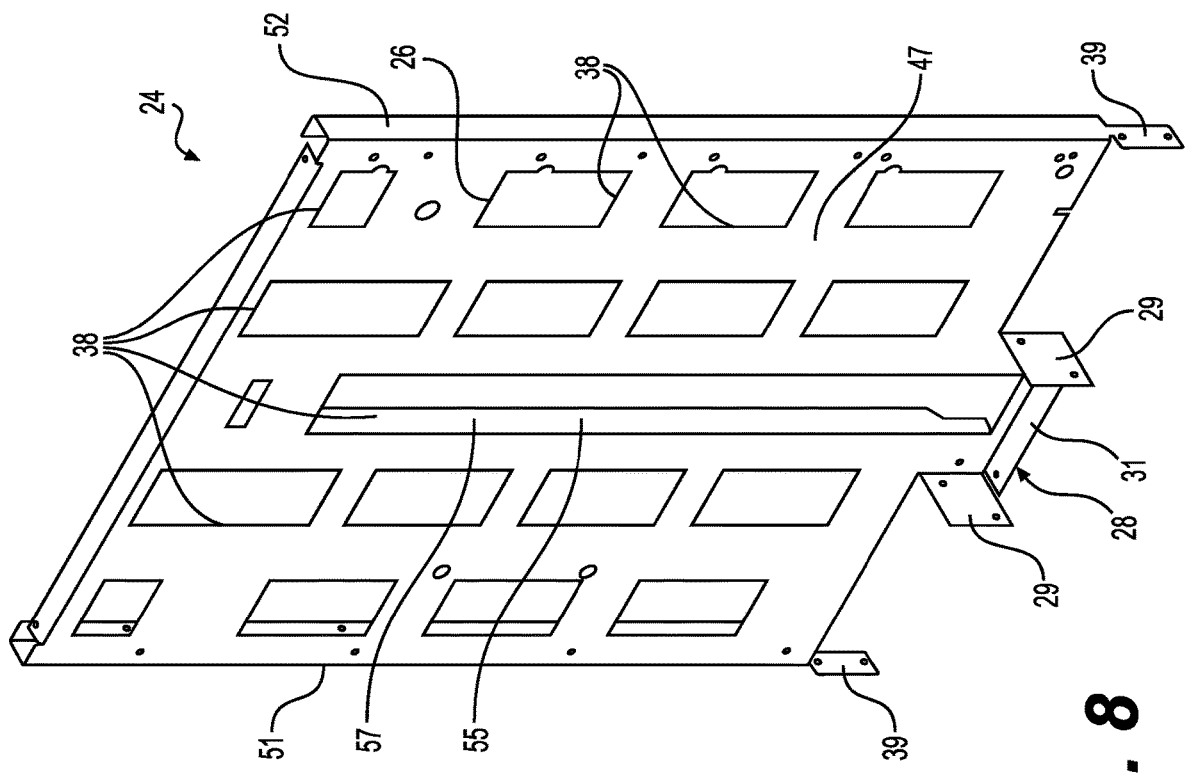
FIG. 8 is a perspective view of the vertical wall support of FIG. 7.

The vertical wall supports 24 are laterally spaced from one another so as to define housing sections 25 therebetween. In this embodiment, the frame 12 includes four vertical wall supports 24 which define three housing sections 25 between adjacent ones of the vertical wall supports 24. The four vertical wall supports 24 are slightly different from one another, however they are generally disposed similarly with respect to the base 22. FIGS. 7 and 8 show an exemplary one of the vertical wall supports 24, in particular one of the two laterally middle vertical wall supports 24, and will be used to generally describe all of the vertical wall supports 24.

The vertical wall support 24 extends generally parallel to a vertical plane extending in the depth direction of the rack 10. As can be seen, the vertical wall support 24 has an upper portion 26 and a lower portion 28 extending below the upper portion 26. The lower portion 28 is narrower than the upper portion 26 (i.e., it is smaller in the depth direction of the rack 10) and is generally centered with respect to the front and rear ends 51, 52 of the vertical wall support 24 defined by the upper portion 26. The upper portion 26 is generally planar and extends from the front end 51 to the rear end 52 in the depth direction of the rack 10. As such, the upper portion 26 has opposite planar lateral surfaces 37 (one of which is shown in FIG. 8) that are parallel to a vertical plane extending in the depth direction of the rack 10. The upper portion 26 defines a plurality of rectangular openings 38 in the lateral surfaces 37, including a central rectangular opening 55 that extends along a majority of the height of the vertical wall support 24 and into the lower portion 28. Two flanges 57 extending perpendicular to the lateral surfaces 37 define in part the central opening 55.

The lower portion 28 of the vertical wall support 24 is configured to be connected to the base 22 of the rack 10. To that end, the lower portion 28 has three flanges, including two vertical flanges 29 extending generally perpendicular to the lateral surfaces 37 of the upper portion 26, and a horizontal flange 31 extending perpendicular to the vertical flanges 29 and to the lateral surfaces 37. The vertical flanges 29 are spaced apart from one another in the depth direction of the rack 10. The vertical wall support 24 also includes front and rear flanges 39 that extend downwards from the front and rear ends of the upper portion 26. The manner in which the vertical wall support 24 is connected to the base 22 will be described in detail further below.

In this embodiment, each vertical wall support 24 is made from bent sheet metal and is a single integral component. The vertical wall supports 24 are therefore relatively easy and inexpensive to manufacture.

As shown in FIG. 1, vertical panels 27 are connected to each vertical wall support 24 on either lateral side thereof and extend parallel thereto. Each vertical panel 27 is provided with a plurality of mounts for rails 35 (see FIG. 6) onto which the servers 23 can be mounted. The rails 35 are vertically spaced apart from one another. A portion of each vertical panel 27 extends rearward of the rear ends of the vertical wall supports 24 and forms in part an enclosure for air flow through heat exchangers installed at the rear end of the rack 10.

Figure 6:
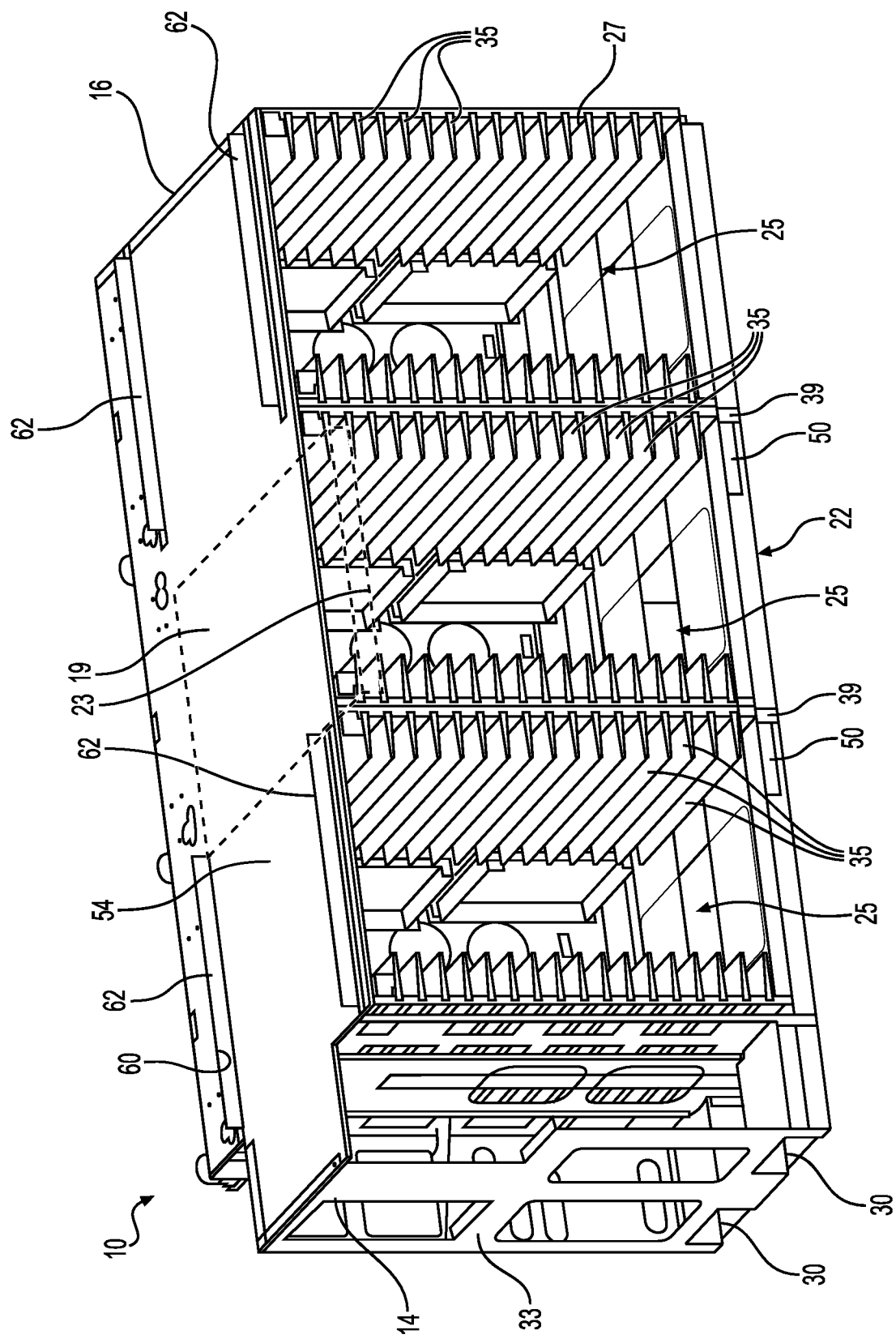
FIG. 6 is a perspective view, taken from a top, left side, of the rack according to another embodiment.

As best shown in FIG. 6, in this embodiment, at the left lateral end 14, the frame 12 has an end frame enclosure 33 for housing additional equipment to service the servers supported by the rack 10 (e.g., a pumping module to pump cooling water to the servers if they are water-cooled). The end frame enclosure 33 includes two sheet metal components that are mechanically fastened to the base 22 and extend upwardly therefrom. The end frame enclosure 33 may be omitted in other embodiments.

An upper frame member 54 extending parallel to the base 22 and defining at least in part the upper end 19 of the rack 10 interconnects the upper ends of the vertical wall supports 24 as well as the upper end of the end frame enclosure 33. Notably, as can be seen, the upper frame member 54 is a generally planar sheet metal component that is mechanically fastened to the upper ends of the vertical wall supports 24 and the upper end of the components of the end frame enclosure 33. The upper ends of the vertical wall supports 24 are thus prevented from getting closer to one another via their connection to the upper frame member 54.

In some embodiments, as shown for instance in FIG. 6, alignment features 60 are provided on the upper frame member 54 and extend upwardly therefrom. The alignment features 60 are configured to align the rack 10 with another such rack 10 that is to be stacked thereon. Notably, when two racks 10 are optionally stacked atop one another, the alignment features 60 of the bottom rack 10 are aligned with the front and rear edges of the base 22 of the upper rack 10 so that the base 22 of the upper rack 10 is disposed, in the depth direction, between two of the alignment features 60. In the example of FIG. 6, the alignment features 60 include four alignment members 62 which are mechanically fastened to the upper frame member 54.

As mentioned above, the rack 10 is designed to be lifted by the lifting machine 200. To that end, the base 22 defines two openings 30 extending in the lateral direction of the rack 10, from one end lateral end of the base 22 to the opposite lateral end of the base 22, for receiving a fork of the lifting machine 200 along the lateral direction as shown in FIG. 17. More specifically, each opening 30 can receive a respective arm of the fork of the lifting machine 200. As will be explained below, the base 22 also defines additional openings to receive the fork of the lifting machine 200 along the depth direction of the rack 10.

In this embodiment, the base 22 includes four different components that are mechanically fastened to one another, including an upper base member 32, a lower base member 34 and two side base members 36. The base 22 is made of sheet metal, namely as the upper base member 32, the lower base member 34 and the side base members 36 are all sheet metal components.

Figure 15:
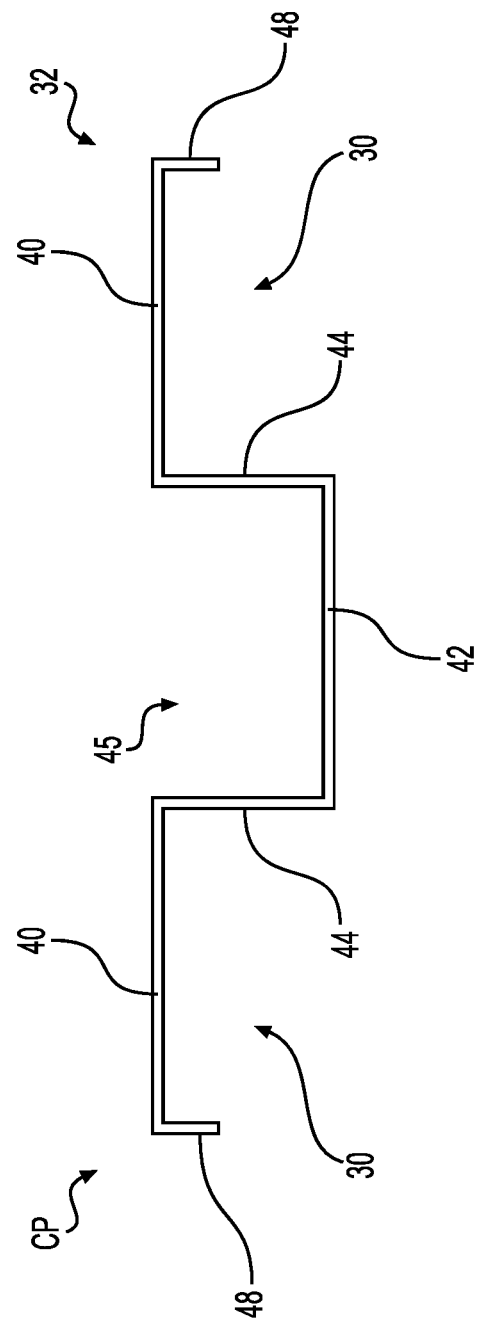
FIG. 15 is a cross-sectional view of the upper base member of FIG. 7 taken along line 15-15 in FIG. 7.

The upper base member 32 of the base 22 has a shape that imparts significant rigidity to the rack 10. Notably, as shown in FIGS. 7 and 15, the upper base member 32 includes two parallel upper walls 40 and a lower wall 42 disposed between the two upper walls 40 along the depth direction and extending vertically lower than the upper walls 40. As can be seen, the lower wall 42 is parallel to the upper walls 40, with each of their lower and upper surfaces extending horizontally. The upper and lower walls 40, 42 are rectangular in shape. Two inner side walls 44 extend vertically between the lower wall 42 and the upper walls 40. The two inner side walls 44 and the lower wall 42 together define a middle cavity 45 which is open at its top, such that the middle cavity 45 may be referred to as a channel. The upper base member 32 also has two outer side walls 48 that extend vertically downward from respective ones of the two upper walls 40 (opposite the inner side walls 44). Each outer side wall 48 defines two rectangular recesses 49. As can be observed with reference to FIG. 15, a cross-sectional profile CP of the upper base member 32 taken along a vertical plane extending in the depth direction of the rack 10 thus has a step-function shape including three horizontal parts ("plateaus") corresponding to the upper and lower walls 40, 42 and at least two vertical parts corresponding to the inner side walls 44 linking the horizontal parts.

Figure 4:
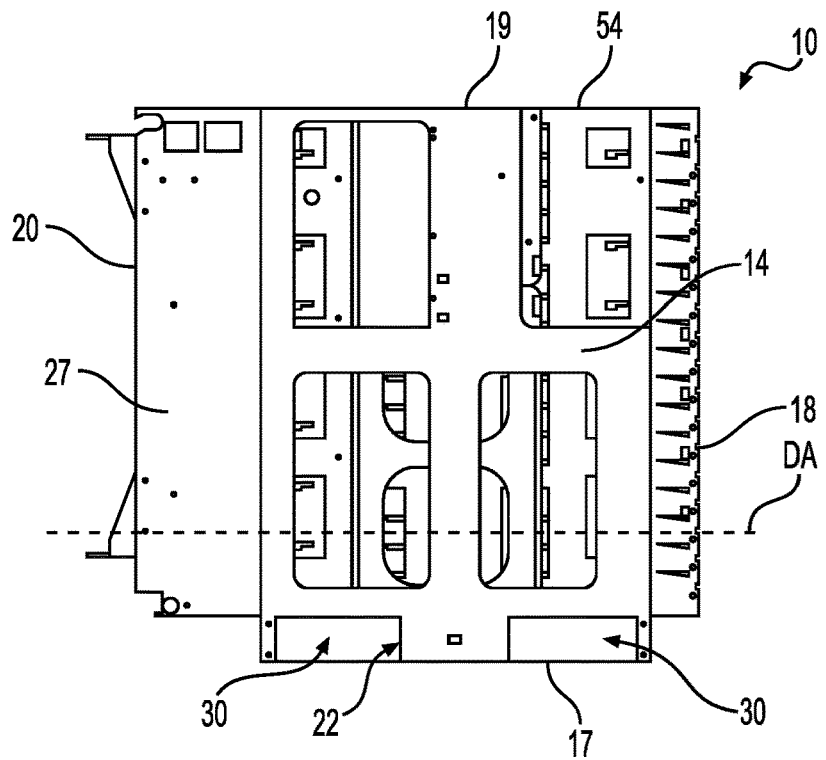
FIG. 4 is a left side elevation view of the rack of FIG. 1.
Figure 5:
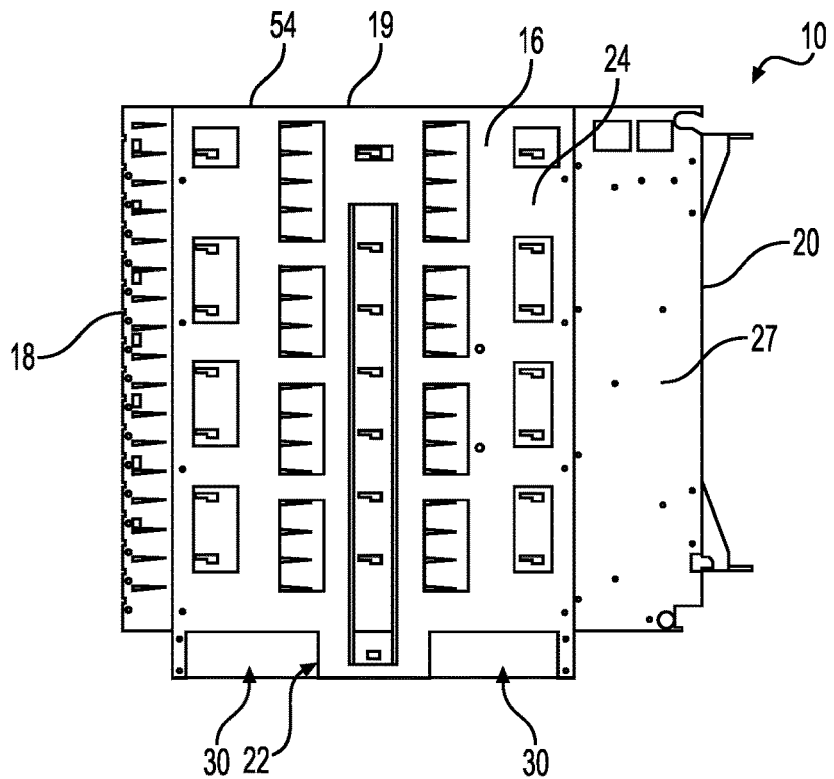
FIG. 5 is a right side elevation view of the rack of FIG. 1.

The above-described shape of the upper base member 32 is particularly helpful in resisting moments tending to bend the rack 10 about an axis DA (see FIG. 4) extending along the depth direction of the rack 10. Notably, in use, the rack 10 supports heavy equipment, namely air-to-liquid heat exchangers at the rear end 20 for cooling the servers supported by the rack 10 which can thus generate significant moments about the axis LT.

Figure 9:
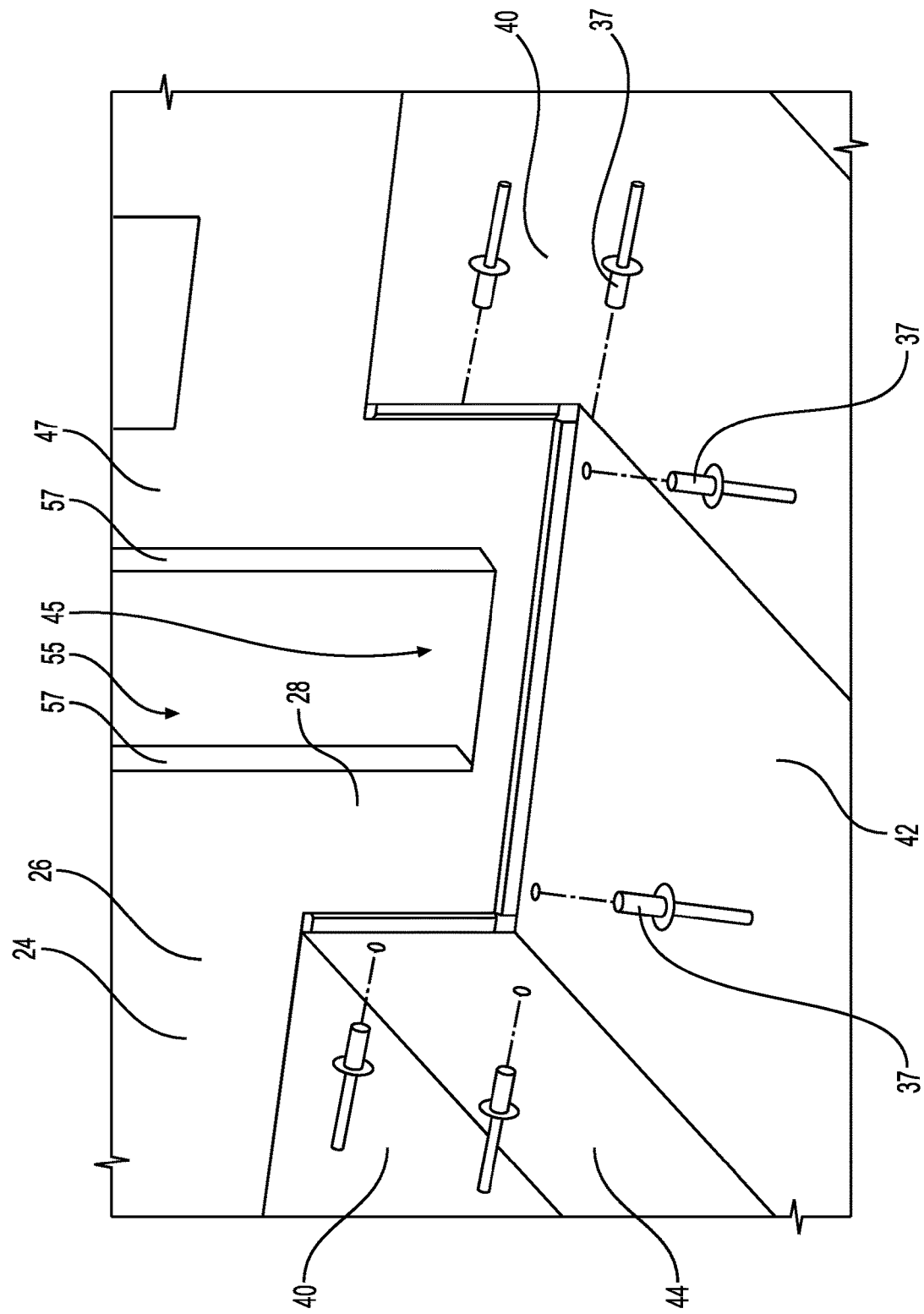
FIG. 9 is a detailed view, taken from a bottom perspective, of the vertical wall support and the upper base member of FIG. 7 being fastened to one another.
Figure 10:
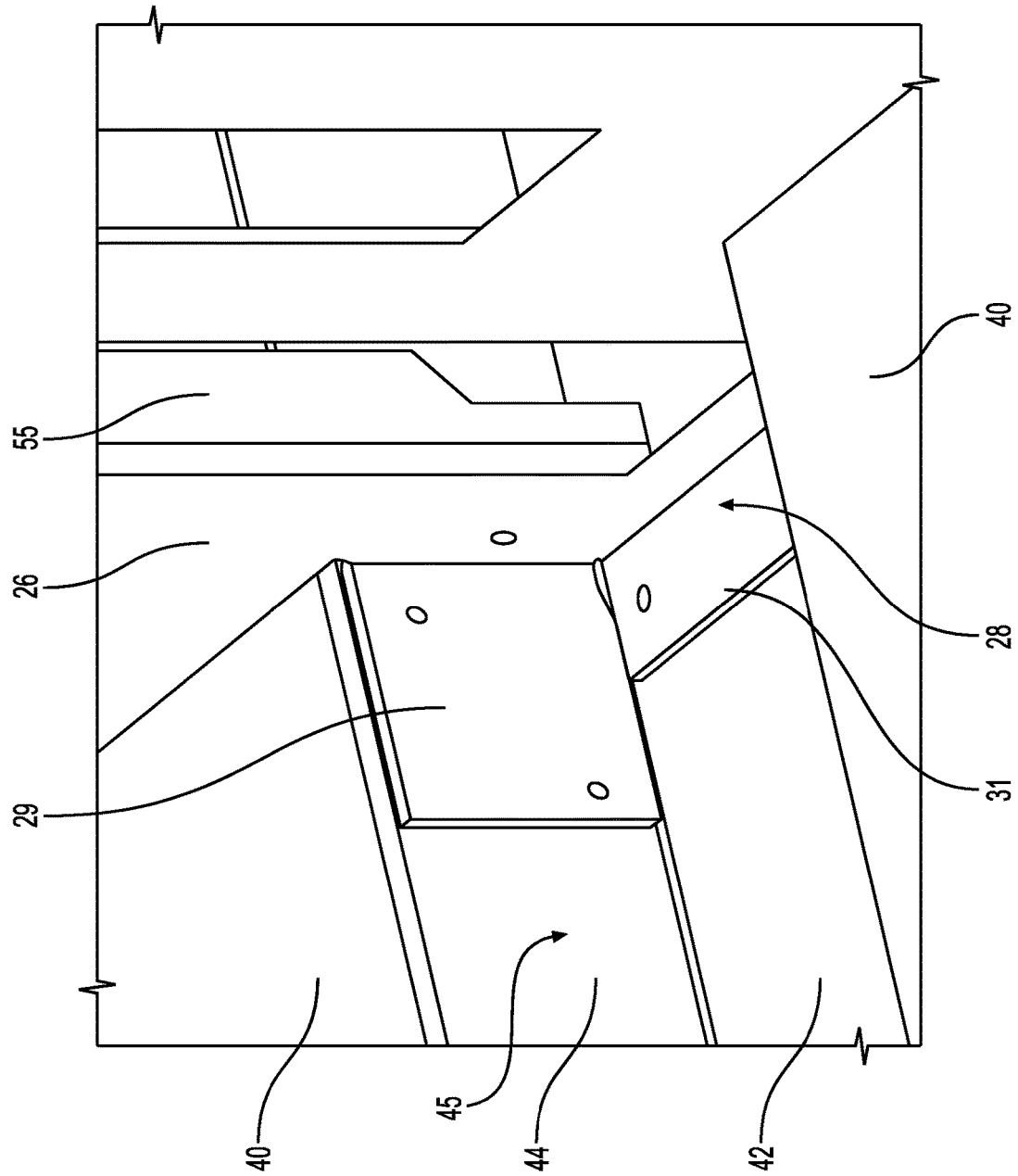
FIG. 10 is a perspective view of a lower portion of another vertical wall support being fastened to the upper base member.

Furthermore, the vertical wall supports 24 extend into the middle cavity 45 defined by the two inner side walls 44 and the lower wall 42 of the upper base member 32. Notably, the lower portion 28 of each vertical wall support 24 extends between the two inner side walls 44. The lower portion 28 of each vertical wall support 24 is fastened to the two inner side walls 44. In particular, as shown in FIGS. 7, 9 and 10, the two vertical flanges 29 extend parallel to the inner side walls 44 and are fastened thereto. Moreover, the horizontal flange 31 extends parallel to the lower wall 42 and is fastened thereto. Notably, as can be seen in FIG. 9, the flanges 29, 31 are mechanically fastened to the upper base member 32 by rivets 37. The connection between the vertical wall supports 24 and the lower wall 42 and inner side walls 44 of the upper base member 32 further adds to the rigidity of the base 22 as it resists bending moments about an axis LA (see FIG. 2) applied on the rack 10, for example resisting the separation of the inner side walls 44 from one another. Moreover, the perpendicular disposition of the vertical wall supports 24 relative to the base 22 ensures that the rack 10 can properly support its rated load which might otherwise be more difficult to do if the wall supports 24 were not perpendicular to the base 22. The bends in the sheet metal of the vertical wall supports 24 forming the vertical flanges 57 (defining the central opening 55) of each vertical wall support 24 further helps the frame 12 of the rack 10 to support a load.

Figure 13:
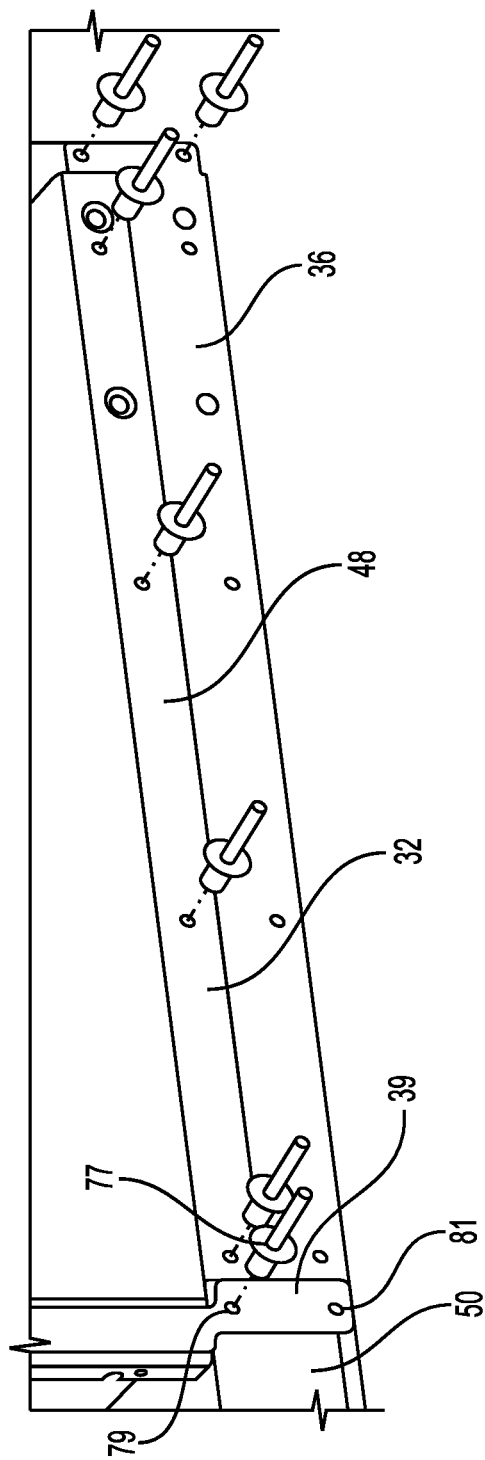
FIG. 13 is a detailed view of part of one of the side base members as it is fastened to the upper base member.

The vertical wall supports 24 are also connected to the front and rear walls 65, 67 of the base 22. Notably, as shown in FIG. 13, the front and rear flanges 39 of the vertical wall supports 24 extend downwardly to overlap the base 22. In particular, the front and rear flanges 39 span the outer side walls 48 of the upper base member 32 and flanges 66 of the lower base member 34 so as to be disposed exteriorly thereof. The front and rear flanges 39 of the vertical wall supports 24 are mechanically fastened to the outer side walls 48 of the upper base member 32. In particular, a mechanical fastener 77 (e.g., a rivet) extends through a respective upper opening 79 defined by each flange 39 and engages an aligned opening of the outer side wall 48 of the upper base member 32. Each of the side base members 36 defines an opening 80 that is aligned with the upper opening 79 and has a greater diameter to allow the fastener 77 to extend therethrough.

The shape of the upper base member 32 also defines the openings 30. Notably, as shown in FIG. 15, each opening 30 is defined in part by one of the upper walls 40, an adjacent one of the inner side walls 44, and an adjacent one of the outer side walls 48. In particular, for each opening 30, the corresponding upper wall 40, inner side wall 44 and outer side wall 48 form an upper boundary and inner and outer side boundaries of that opening 30. As will be described in more detail below, each of the inner side walls 44 also defines two rectangular openings 46 which are longer laterally than vertically.

In this embodiment, the upper base member 32 is a single piece component. That is, the upper base member 32 is made of a continuous piece of material. As will be understood, this facilitates the manufacture of the base 22 and imparting of the particular shape thereof. Notably, the upper base member 32 is manufactured as a metal sheet which is laser cut and then bent into the above-described shape.

Figure 11:
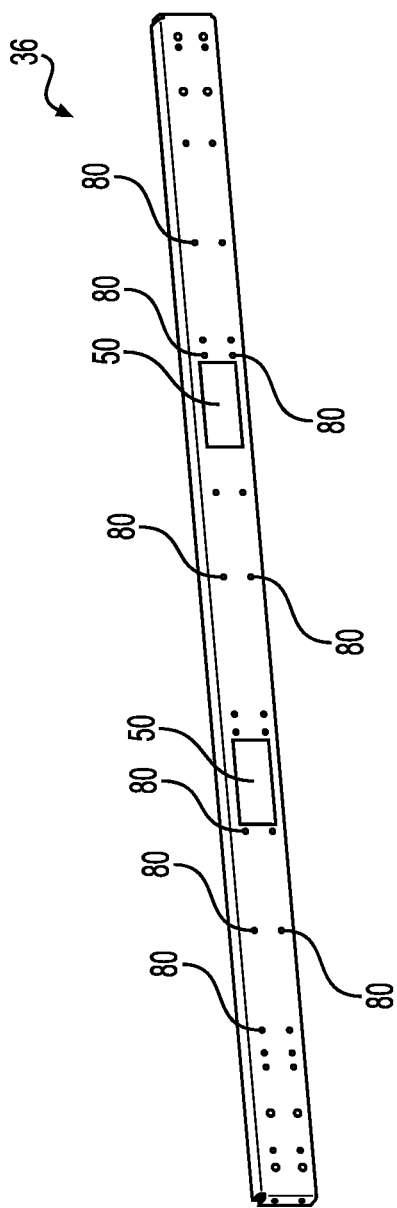
FIG. 11 is a perspective view of one of two side base members of the base.
Figure 12:
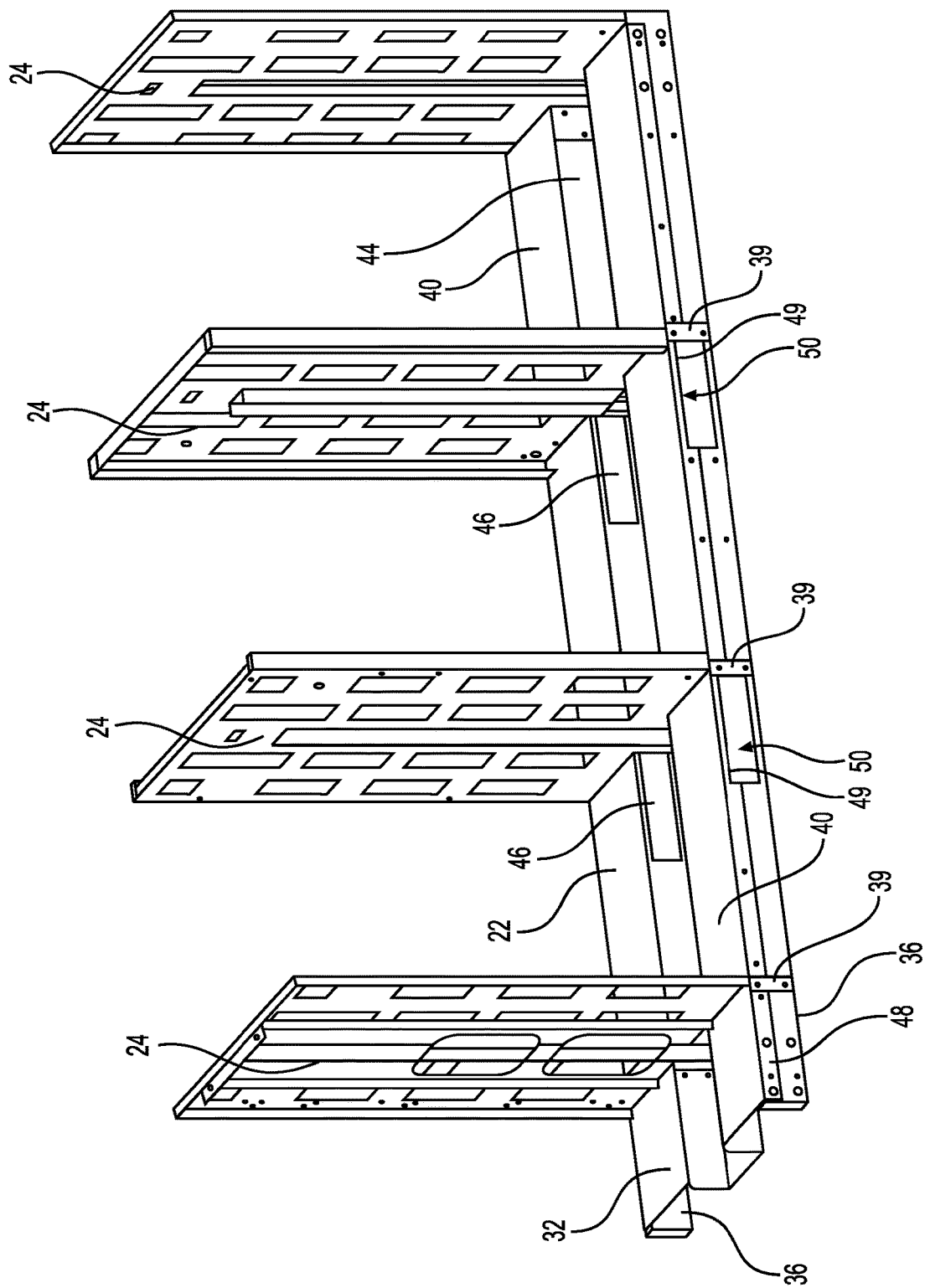
FIG. 12 is a perspective view of another step in the assembly of the rack as the side base members and other vertical wall supports are fastened to the upper base member.
Figure 14:
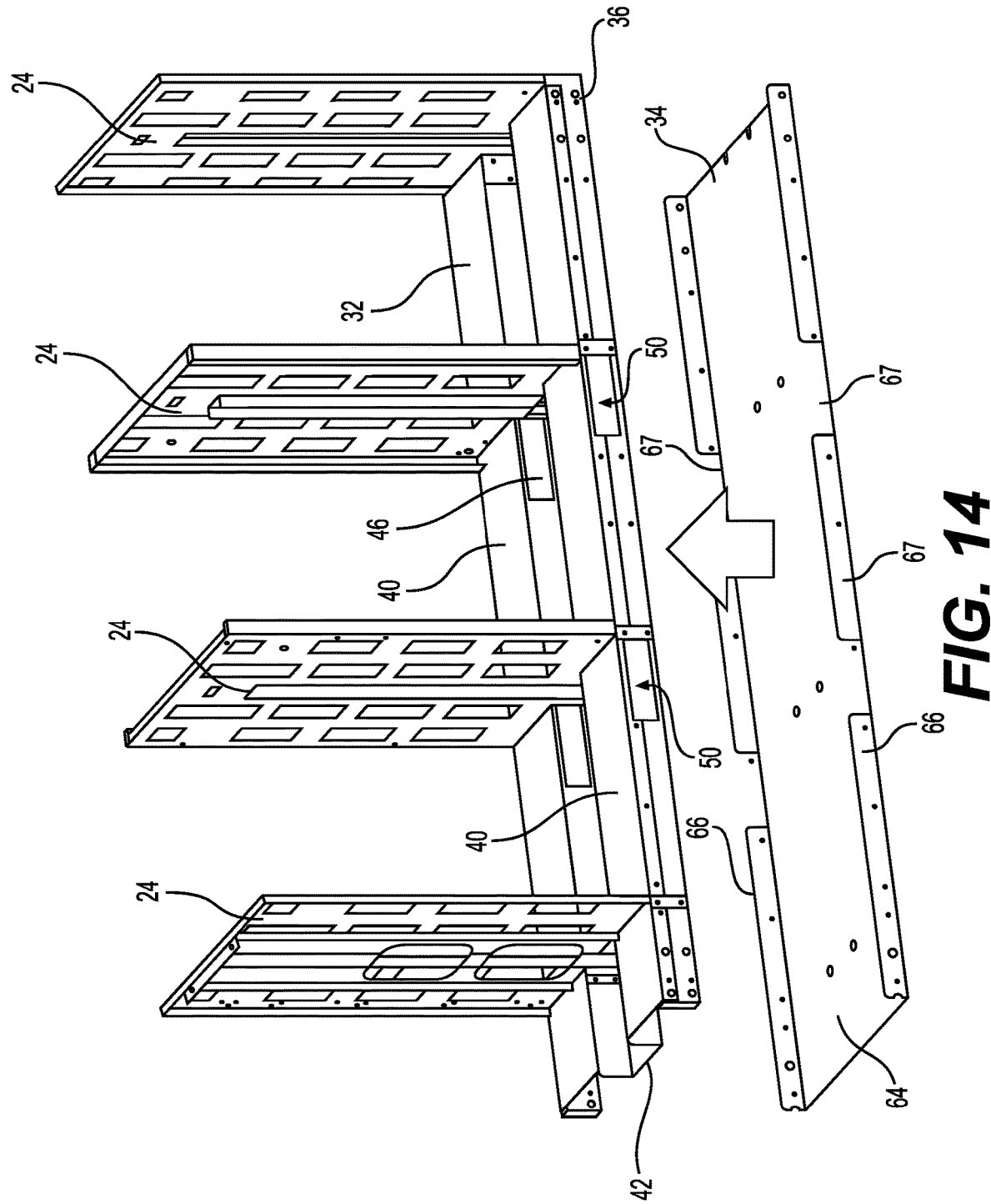
FIG. 14 is a perspective view of another step in the assembly of the rack as a lower base member is fastened to the side base members to form a base of the frame of the rack.

At its front and rear, the upper base member 32 is fastened to the side base members 36. As shown in FIG. 11, each side base member 36 is an elongated rectangular component defining two rectangular openings 50 that are laterally spaced from one another. Each side base member 36 also defines a plurality of circular openings 80, some of which are provided for connecting the side base members 36 to the upper and lower base members 32, 34. When the base 22 is assembled, the side base members 36 extend from one lateral end of the base 22 to the other lateral end of the base 22, and the rectangular openings 50 are defined in a front wall 65 and a rear wall 67 of the base 22 (shown in FIGS. 2 and 3). As shown in FIG. 13, the side base members 36 are mechanically fastened to the outer side walls 48 of the upper base member 32. Furthermore, as shown in FIG. 14, the lower base member 34 is mechanically fastened to the side base members 36 so as to close off the bottom of the base 22. Notably, the lower base member 34 has a bottom planar portion 64 that extends horizontally and two flanges 66 extending vertically upward from the bottom planar portion 64 at the front and rear ends thereof. The flanges 66 are mechanically fastened to the side base members 36. When the base 22 is assembled, the bottom planar portion 64 of the lower base member 34 forms a bottom boundary of the openings 30.

Once the lower base member 34 is secured to the side base members 36, the front and rear flanges 39 of the vertical wall supports 24 are mechanical fastened to the respective front and rear flanges 66 of the lower base member 34, namely by inserting a fastener (e.g., a rivet) into a lower opening 81 (see FIG. 13) of each flange 39. The fasteners engage aligned openings of the flanges 66 of the lower base member 34. Each of the side base members 36 defines an opening 80 that is aligned with the lower opening 79 and has a greater diameter to allow the fastener to extend therethrough.

By avoiding fastening the front and rear flanges 39 of the vertical wall supports 24 to the side base members 36, the frame 12 of the rack 10 is made more rigid as fewer breaks in the outer side walls 48 and the flanges 66 need to be provided to accommodate a direct connection of the flanges 39 to the side base member 36 which can help in increasing resistance of the base 22 to bending moments about the axis DA.

As can be seen, each rectangular opening 50 of the side base members 36 is aligned with a corresponding rectangular recess 49 of the outer side walls 48 of the upper base member 32. As such, both on the front and rear sides of the base 22, the outer side walls 48 do not obstruct the openings 50. The openings 50 on opposite front and rear sides of the base 22 are aligned with one another and are aligned with two respective ones of the openings 46 defined by each of the inner side walls 44. In other words, as can be observed from FIGS. 2 and 3, each opening 50 is aligned, in the lateral direction of the rack 10, with an opposite opening 50 and an opening 46 of each of the inner side walls 44, thus resulting in two laterally-spaced rows of four aligned openings.

As shown in FIG. 14, each flange 66 of the lower base member 34 defines two rectangular recesses 67 laterally spaced from one another so as not to obstruct the openings 50. That is, the recesses 67 of the flanges 66 are aligned with the openings 50 so as to avoid the flanges 66 covering the openings 50 and thereby obstructing them.

As shown in FIG. 16, the aligned openings 46, 50 allow the insertion of the arms of the fork of the lifting machine 200 therethrough so that the lifting machine 200 can also handle the rack 10 in the depth direction. Therefore, as will be understood, the lifting machine 200 can approach the rack 10 and engage it so as to lift the rack 10 from the front, from the rear, from the left and from the right. This provides the operator of the lifting machine 200 with increased flexibility in the handling of the rack 10 which can be useful in a data center since floor space for circulating within a data center is limited as it is generally desired to occupy the available floor space for storing as many racks and thus servers as possible for efficient use of the floor space. Thus the ability of handling the rack 10 from such a variety of directions provides the operator of the lifting machine 200 with more possibilities when it is not feasible or it is otherwise impractical to engage the rack 10 from a particular direction.

In this embodiment, the entire base 22, and moreover the entire frame 12, of the rack 10 is made of sheet metal components that are formed as sheets, are cut and, where applicable, are bent into their final shape. This provides an easy and inexpensive method of manufacture which can be applied at large scale when producing many racks 10. In this embodiment, the material used for the metal sheet components of the frame 12 is galvanized steel. Other metals may be used in other embodiments (e.g., stainless steel).

It is contemplated that, in some cases, the base 22 of the rack 10 may be sold on its own, independently of the remainder of the rack 10. For instance, this may be useful to retrofit an existing rack with the base 22, thereby providing the retrofitted rack with the advantages of the base 22 mentioned above. As such, the base 22 may be purchased on its own and used to adapt a rack to be more versatile in handling, allowing a lifting machine to transport the rack in perpendicular directions, while providing the rack with greater rigidity.

Modifications and improvements to the above-described implementations of the present technology may become apparent to those skilled in the art. The foregoing description is intended to be exemplary rather than limiting. The scope of the present technology is therefore intended to be limited solely by the scope of the appended claims.

What is claimed is:

1. A rack for supporting data center equipment including servers, the rack comprising:
    a frame having first and second lateral ends opposite one another in a lateral direction of the rack, and front and rear ends opposite one another in a depth direction of the rack, the depth direction being perpendicular to the lateral direction, the frame comprising:
        at least two vertical wall supports laterally spaced apart from one another, the at least two vertical wall supports provided with a plurality of laterally-extending mounting rails that are vertically spaced apart from each other to supportively accommodate mounting of the servers within the rack, each of the at least two vertical wall supports including a respective lower portion incorporating two parallel vertically-extending flanges; and
        a base structure defining a bottom portion of the rack and mechanically fastened to the lower portion of the at least two vertical wall supports, the base structure incorporating a first opening and a second opening extending in the lateral direction of the rack for receiving a fork of a lifting machine along the lateral direction of the rack, the base structure comprising:
            a first upper wall defining in part the first opening;
            a second upper wall defining in part the second opening, the second upper wall being generally parallel to the first upper wall;
            a lower wall disposed between the first and second upper walls along the depth direction, the lower wall extending vertically lower than the first and second upper walls;
            two parallel side walls extending at least partly vertically upwards from the lower wall to a respective one of the first and second upper walls, the two parallel side walls and the lower wall defining together a middle cavity; and
            each of the two parallel side walls defining a third opening and a fourth opening for receiving the fork of the lifting machine along the depth direction of the rack,
            wherein, the two parallel side walls and the middle cavity of the base structure are configured to accommodate the two parallel vertically-extending flanges of the at least two vertical wall supports for mechanically fastening the base structure thereto, and
            wherein, a first vertically-extending flange of the two parallel vertically-extending flanges is fastened to a first side wall of the two parallel side walls, a second vertically-extending flange of the two parallel vertically-extending flanges is fastened to a second side wall of the two parallel side walls, and each of the at least two vertical wall supports further comprises a horizontally-extending flange fastened to the lower wall.

2. The rack of claim 1, wherein the at least two vertical wall supports include at least four vertical wall supports laterally spaced apart from one another.

3. The rack of claim 1, wherein the base structure comprises an upper base member defining the first and second upper walls and the lower wall, the upper base member being a single piece component.

4. The rack of claim 1, wherein the base structure comprises:
    an upper base member defining the first and second upper walls and the lower wall; and
    a lower base member extending below the upper base member and forming a bottom horizontal wall that defines, together with the upper base member, the first and second openings.

5. The rack of claim 1, wherein at least a majority of the base structure is made of sheet metal.

6. The rack of claim 1, wherein a width of the rack measured between the first and second lateral ends is greater than a height of the rack measured between a lower end and an upper end of the rack.

7. The rack of claim 1, wherein:
    part of a cross-sectional profile of the base structure taken along a vertical plane extending in the depth direction has a step-function shape; and
    the first and second upper walls and the lower wall form horizontal parts of the step-function shape and the two parallel side walls form vertical parts of the step-function shape.

8. The rack of claim 1, wherein the frame further comprises an upper frame member extending parallel to the base structure, the upper frame member being connected to an upper end of each of the at least two vertical wall supports.

9. The rack of claim 8, wherein the frame further comprises alignment features extending upwardly from the upper frame member for aligning the rack with another rack stacked thereon.

10. The rack of claim 1, wherein the first and second openings extend from a first lateral end of the base structure to a second lateral end of the base structure.

11. The rack of claim 1, wherein the base structure has a front wall and a rear wall opposite one another in the depth direction, each of the front wall and the rear wall defining a fifth opening and a sixth opening that are laterally spaced from one another, the fifth opening and the sixth opening being aligned with the third opening and the fourth opening respectively.

* * * * *